United States Patent
Kuo et al.

(10) Patent No.: US 8,283,941 B2
(45) Date of Patent: Oct. 9, 2012

(54) ALTERNATING CURRENT (AC) STRESS TEST CIRCUIT, METHOD FOR EVALUATING AC STRESS INDUCED HOT CARRIER INJECTION (HCI) DEGRADATION, AND TEST STRUCTURE FOR HCI DEGRADATION EVALUATION

(75) Inventors: Sung-Nien Kuo, Taipei (TW); Yuan-Yu Hsieh, Hsinchu (TW); Wen-Hsiung Ko, Taichung (TW); Jih-San Lee, Hsinchu (TW); Kuei-Chi Juan, Hsinchu (TW); Kuan-Cheng Su, Hsinchu (TW)

(73) Assignee: United Microelectronics Corp., Hsinchu (TW)

( * ) Notice: Subject to any disclaimer, the term of this patent is extended or adjusted under 35 U.S.C. 154(b) by 308 days.

(21) Appl. No.: 12/703,949

(22) Filed: Feb. 11, 2010

(65) Prior Publication Data

US 2011/0193586 A1    Aug. 11, 2011

(51) Int. Cl.
*G01R 31/02* (2006.01)
*G01R 31/26* (2006.01)
(52) U.S. Cl. .................. 324/762.01; 324/762.09
(58) Field of Classification Search .......... None
See application file for complete search history.

(56) References Cited

U.S. PATENT DOCUMENTS

| | | | |
|---|---|---|---|
| 6,310,487 B1 * | 10/2001 | Yokomizo | 324/750.3 |
| 6,628,134 B1 * | 9/2003 | Lee | 324/762.01 |
| 6,629,295 B1 | 9/2003 | Akimoto et al. | |
| 2009/0063061 A1 * | 3/2009 | Bolam et al. | 702/58 |

OTHER PUBLICATIONS

Quader et al., "Hot-Carrier-Reliability Design Rule for Tranlating Device Degration to CMOS Digital Circuit Degration", IEEE vol. 41, No. 5, May 1994.

* cited by examiner

*Primary Examiner* — Roberto Velez
(74) *Attorney, Agent, or Firm* — Chun-Ming Shih (57) ABSTRACT

An AC stress test circuit for HCI degradation evaluation in semiconductor devices includes a ring oscillator circuit, first and second pads, and first and second isolating switches. The ring oscillator circuit has a plurality of stages connected in series to form a loop. Each of the stages comprises a first node and a second node. The first and second isolating switches respectively connect the first and second pads to the first and second nodes of a designated stage and both are switched-off during ring oscillator stressing of the designated stage. The present invention also provides a method of evaluating AC stress induced HCI degradation, and a test structure.

18 Claims, 5 Drawing Sheets

ALTERNATING CURRENT (AC) STRESS TEST CIRCUIT, METHOD FOR EVALUATING AC STRESS INDUCED HOT CARRIER INJECTION (HCI) DEGRADATION, AND TEST STRUCTURE FOR HCI DEGRADATION EVALUATION

BACKGROUND

1. Technical Field

The present invention broadly relates to reliability testing of semiconductor devices and, particularly to an alternating current (AC) stress test circuit for hot carrier injection (HCI) degradation evaluation, a method for evaluating/predicting AC stress induced HCI degradation and a test structure for HCI degradation evaluation in semiconductor devices.

2. Description of the Related Art

In the course of enhancing semiconductor device design and performance, faster circuit operation has been achieved with the reduction of transistor sizes. For designers, attempts to continue to improve device performance face increasing challenges as further reductions in transistor sizes are sought. For example, it is commonly known that a problem with hot carrier injection increases as device sizes shrink.

Hot carrier injection (HCI) occurs as a result of the reduced channel size of sub-micron transistors causing an increase in the electric field, which can allow the carrier to be injected into the gate dielectric of the transistor. Over time, the resulting charged gate dielectric causes device degradation, raising the threshold voltage and reducing the transconductance. Device testing attempts to determine the rate of degradation due to HCI.

Conventionally, an AC to DC (AC/DC) conversion factor is used to express the rate of HCI degradation in semiconductor devices. A traditional approach for getting the AC/DC conversion factor involves the use of an inverter ring oscillator for investigation of dynamic (AC) stress induced HCI degradation and the use of a single device for investigation of static (DC) stress induced HCI degradation. In particular, higher stress-voltages are forced in the inverter ring oscillator to get AC frequency degradation at 1.1 Vcc, and higher stress-voltages are forced in the single device to get DC Idsat (i.e., drain saturated drain current) degradation at 1.1 Vcc, wherein Vcc is a power supply voltage. Thereafter, the AC/DC conversion factor is determined by a ratio of a lifetime of M % frequency change during ring oscillator stressing (i.e., AC stressing) to another lifetime of 10% Idsat change during DC stressing, wherein M % is set to be 2.5% for nMOS device or else is set to be 5% for pMOS device.

In fact, a definition of the AC/DC conversion factor is a ratio of time to failure (TTF)@AC Idsat 10% degradation to TTF@DC Idsat 10% degradation, where the TTF@AC Idsat 10% degradation represents a lifetime of 10% Idsat change during AC stressing, and the TTF@DC Idsat 10% degradation represents a lifetime of 10% Idsat change during DC stressing.

Accordingly, it is found that the traditional approach to get AC Idsat degradation by simulation then using it as a medium to get the correlation between AC frequency degradation and DC Idsat degradation for the purpose of maintaining realistic AC stress waveforms, rather than directly get AC Idsat degradation during ring oscillator stressing. Unfortunately, the accuracy for determining the AC/DC conversion factor by the traditional approach is not satisfactory and thus there is a need for increasing accuracy in evaluating HCI degradation in semiconductor devices.

BRIEF SUMMARY

Accordingly, the present invention is directed to an AC stress test circuit for HCI degradation evaluation in semiconductor devices, which is adapted to use for evaluating/predicting HCI degradation with an increased accuracy.

The present invention is further directed to a method for evaluating AC stress induced HCI degradation in semiconductor devices, for the purpose of increasing accuracy in evaluating HCI degradation.

The present invention is still further directed to a test structure for HCI degradation evaluation in semiconductor devices, which is adapted to use for evaluating HCI degradation with an increased accuracy.

In particular, an AC stress test circuit for HCI degradation evaluation in semiconductor devices in accordance with an embodiment of the present invention comprises a ring oscillator circuit, a first pad, a second pad, a first isolating switch and a second isolating switch. The ring oscillator circuit has a plurality of stages connected in series between an input terminal and an output terminal electrically connected with the input terminal and whereby forming a loop. Each of the stages comprises a first node and a second node. A designated one of the stages serves as device under test (DUT). The first isolating switch and the second isolating switch respectively electrically connect the first pad and the second pad to the first node and the second node of the DUT.

In one embodiment, the DUT comprises a first-type transistor and a second-type transistor, the gates of the first-type and second-type transistors are electrically connected to the first node, the drains/sources of the first-type and second-type transistors are electrically connected to the second node, the first isolating switch and the second isolating switch both are second-type transistors, such configuration generally can be used for evaluating AC stress induced HCI degradation in the first-type transistor of the DUT.

In one embodiment, the DUT comprises a first-type transistor and a second-type transistor, the gates of the first-type and second-type transistors are electrically connected to the first node, the drains/sources of the first-type and second-type transistors are electrically connected to the second node, the first isolating switch and the second isolating switch both are first-type transistor, such configuration generally can be used for evaluating AC stress induced HCI degradation in the second-type transistor of the DUT.

In one embodiment, the first isolating switch comprises a first-type transistor and a second-type transistor electrically connected in parallel and between the first node and the first pad, the second isolating switch comprises a first-type transistor and a second-type transistor electrically connected in parallel and between the second node and the second pad. Such configuration can be used for evaluating AC stress induced HCI degradation in both the second-type transistor and the first-type transistor of the DUT.

In one embodiment, the AC stress test circuit further comprises a control pad electrically connected to the gates of the first and second isolating switches and for receiving a control signal to switch ON/OFF states of the first and second isolating switches.

In one embodiment, each of the stages is, for example but not limited to an inverter.

In one embodiment, the DUT and each of the input terminal and the output terminal have at least one of the remained stages arranged therebetween.

A method for evaluating AC stress induced HCI degradation in semiconductor devices in accordance with another embodiment of the present invention is adapted to be performed on the above-mentioned AC stress test circuit. The method comprises steps of: during a stress mode of the AC stress test circuit, enabling the AC stress test circuit to apply an internal AC stress to the DUT while the first and second isolating switches both being switched-off; and during a measurement mode of the AC stress test circuit, disabling the AC stress test circuit, switching on both the first and second isolating switches, applying a gate-on voltage to the first node through the first pad, and measuring a current flowing from the second node through the second pad.

In one embodiment, the steps of switching on both the first and second isolating switches and applying the gate-on voltage to first node through the first pad comprise: switching on both the first and second isolating switches by a logic "1" voltage; and applying a logic "0" voltage to the first node through the first pad for switching on e.g, the first-type transistor of the DUT.

In one embodiment, the steps of switching on both the first and second isolating switches and applying the gate-on voltage to the first node through the first pad comprise: switching on both of the first and second isolating switches by a logic "0" voltage; and applying a logic "1" voltage to the first node through the first pad for switching on e.g., the second-type transistor of the DUT.

A test structure for HCI degradation evaluation in semiconductor devices in accordance with still another embodiment of the present invention comprises an AC stress test circuit and a DC stress test circuit independent from the AC stress test circuit. The AC stress test circuit is used for evaluating AC stress induced HCI degradation, and the DC stress test circuit is used for evaluating DC stress induced HCI degradation. More specifically, in one aspect, the AC stress test circuit comprises a ring oscillator circuit, a first pad, a second pad, a first isolating switch and a second isolating switch. The ring oscillator circuit has a plurality of stages connected in series between an input terminal and an output electrically connected with the input terminal and whereby forming a loop. Each of the stages comprises a first node and a second node. A designated one of the stages serves as a first DUT. The first isolating switch and the second isolating switch respectively connect the first pad and the second pad to the first node and the second node of the first DUT. In another aspect, the DC stress test circuit comprises a second DUT, a third pad and a fourth pad. The second DUT has a same configuration as the first DUT and comprises a third node and a fourth node. The third pad and the fourth pad respectively are electrically connected to the third node and the fourth node.

In one embodiment, the first DUT comprises a first-type transistor and a second-type transistor, the gates of the first-type and second-type transistors are electrically connected to the first node, the drains/sources of the first-type and second-type transistors are electrically connected to the second node, the first isolating switch and the second isolating switch of the AC stress test circuit both are second-type transistors, such configuration generally can be used for evaluating AC stress induced HCI degradation in the first-type transistor of the first DUT.

In one embodiment, the first DUT comprises a first-type transistor and a second-type transistor, the gates of the first-type and second-type transistors are electrically connected to the first node, the drains/sources of the first-type and second-type transistors are electrically connected to the second node, the first isolating switch and the second isolating switch of the AC stress test circuit both are first-type transistors, such configuration generally can be used for evaluating AC stress induced HCI degradation in the second-type transistor of the first DUT.

In one embodiment, the first isolating switch comprises a first-type transistor and a second-type transistor electrically connected in parallel and between the first node and the first pad. The second isolating switch comprises a first-type transistor and a second-type transistor electrically connected in parallel and between the second node and the second pad. Such configuration generally can be used for evaluating AC stress induced HCI degradation in both the first-type transistor and the second-type transistor of the first DUT.

In one embodiment, the AC stress test circuit of the test structure further comprises a control pad electrically connected to the gates of the first and second isolating switches and for receiving a control signal to switch ON/OFF states of the first and second isolating switches.

In one embodiment, each of the stages is, for example but not limited to an inverter.

In one embodiment, the DC stress test circuit of the test structure further comprises a fifth pad, a sixth pad, a third isolating switch and a fourth isolating switch. The third isolating switch and the fourth isolating switch respectively electrically connect the fifth pad and the sixth pad to the third node and the fourth node.

In one embodiment, the first DUT and each of the input terminal and the output terminal have at least one of the remained stages arranged therebetween.

In summary, in the above-mentioned embodiments, the first and second pads (i.e., generally probing pads) are electrically connected to the ring oscillator circuit through the isolating switches maintaining switched-off state during AC stressing (i.e., generally ring oscillator stressing), so that the probing pads could not induce visible distortion to AC stress waveforms internally generated by the ring oscillator circuit. Accordingly, the present invention can get AC Idsat degradation directly during ring oscillator stressing without any simulation and therefore the HCI degradation evaluation in semiconductor devices can achieve an increased accuracy.

BRIEF DESCRIPTION OF THE DRAWINGS

These and other features and advantages of the various embodiments disclosed herein will be better understood with respect to the following description and drawings, in which like numbers refer to like parts throughout, and in which.

DETAILED DESCRIPTION

A better understanding of the above and many other features and advantages of the novel AC stress test circuit, method of evaluating AC stress induced HCI degradation, and test structure of the present invention may be obtained from a consideration of the detailed description of some exemplary embodiments thereof below, particularly if such consideration is made in conjunction with the appended drawings, wherein like reference numerals are used to identify like elements illustrated in one or more of the figures thereof.

Figure 1:
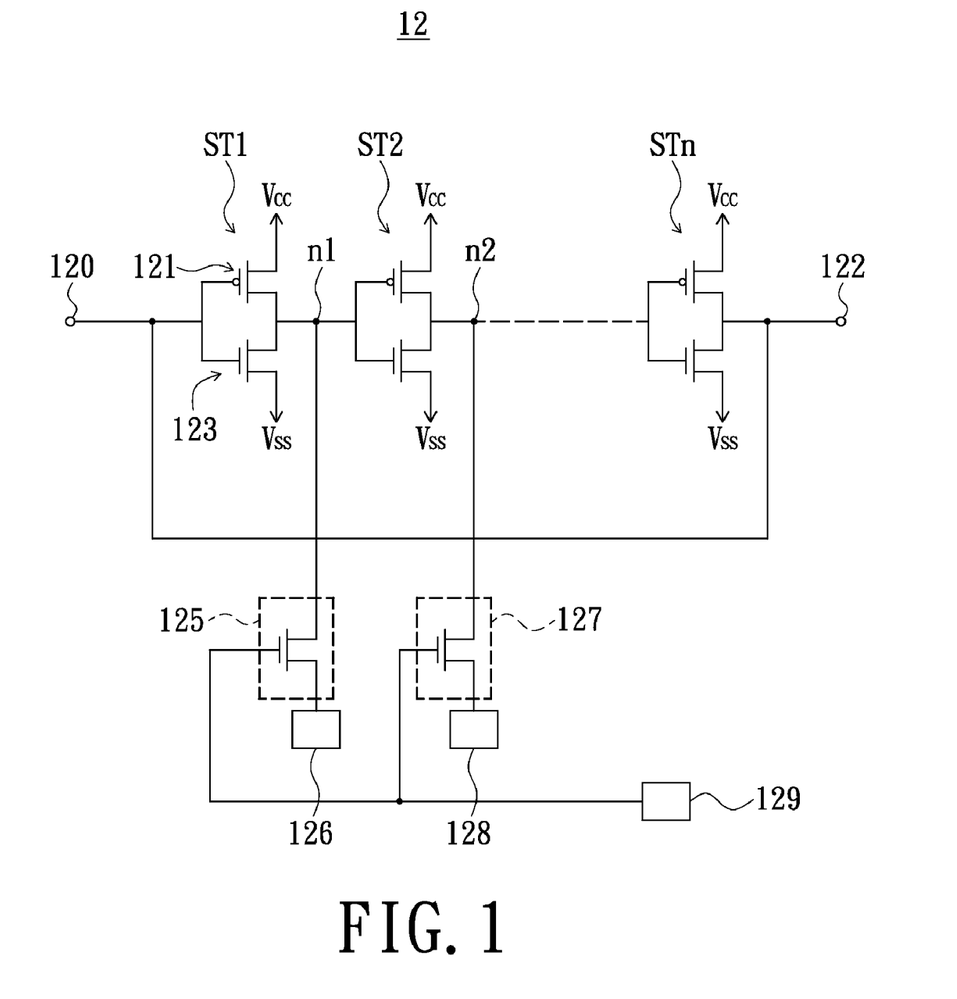
FIG. 1 shows a schematic circuit diagram of an AC stress test circuit in accordance with an embodiment of the present invention.

Referring to FIG. 1, showing a schematic circuit diagram of an AC stress test circuit in accordance with an embodiment of the present invention. In particular, the AC stress test circuit 12 is a ring oscillator stress test circuit and generally comprises a ring oscillator circuit, isolating switches 125, 127, probing pads 126, 128, and a control pad 129. The ring oscillator circuit comprises an input terminal 120, an output terminal 122 electrically connected with the input terminal 120, and a plurality of stages ST1~STn connected in series between the input terminal 120 and the output terminal 122 and whereby forming a loop. Herein, each of the stages ST1~STn is for example, but not limited to an inverter and comprises a P-type transistor (i.e., P-type MOSFET device) 121 and an N-type transistor 123 connected in series between power supply voltages Vcc and Vss, one of the stages ST1~STn e.g., the stage ST2 is designated as device under test (DUT). As seen from FIG. 1, the DUT ST2 and each of the input terminal 120 and the output terminal 122 have at least one of remained stages arranged therebetween, but are not limited to the present invention.

In the DUT, the gate of the P-type transistor 121 is electrically connected with the gate of the N-type transistor 123 and whereby defining a node n1, the drain/source of the P-type transistor 121 is electrically connected with the drain/source of the N-type transistor 123 and whereby defining another node n2, the source/drain of the P-type transistor 121 is electrically connected to the power supply voltage Vcc, and the source/drain of the N-type transistor 123 is electrically connected to the power supply voltage Vss.

The probing pad 126 is electrically connected to the node n1 through the isolating switch 125, the probing pad 128 is electrically connected to the node n2 through the isolating switch 127, the control pad 129 is electrically connected to both the gates of the isolating switches 125 and 127 and for receiving a control signal to switch ON/OFF states of the isolating switches 125 and 127. More specifically, the isolating switches 125 and 127 both are N-type transistor, such configuration generally can be used for evaluating the AC stress induced HCI degradation in the P-type transistor 121 of the DUT. The probing pad 126 is electrically connected to the source/drain of the N-type transistor of the isolating switches 125, the probing pad 128 is electrically connected to the source/drain of the N-type transistor of the isolating switches 127, the control pad 129 is electrically connected to the gates of the N-type transistors of the isolating switches 125 and 127, the drain/source of the N-type transistor of the isolating switch 125 is electrically connected to the node n1, and the drain/source of the N-type transistor of the isolating switch 127 is electrically connected to the node n2.

Figure 2:
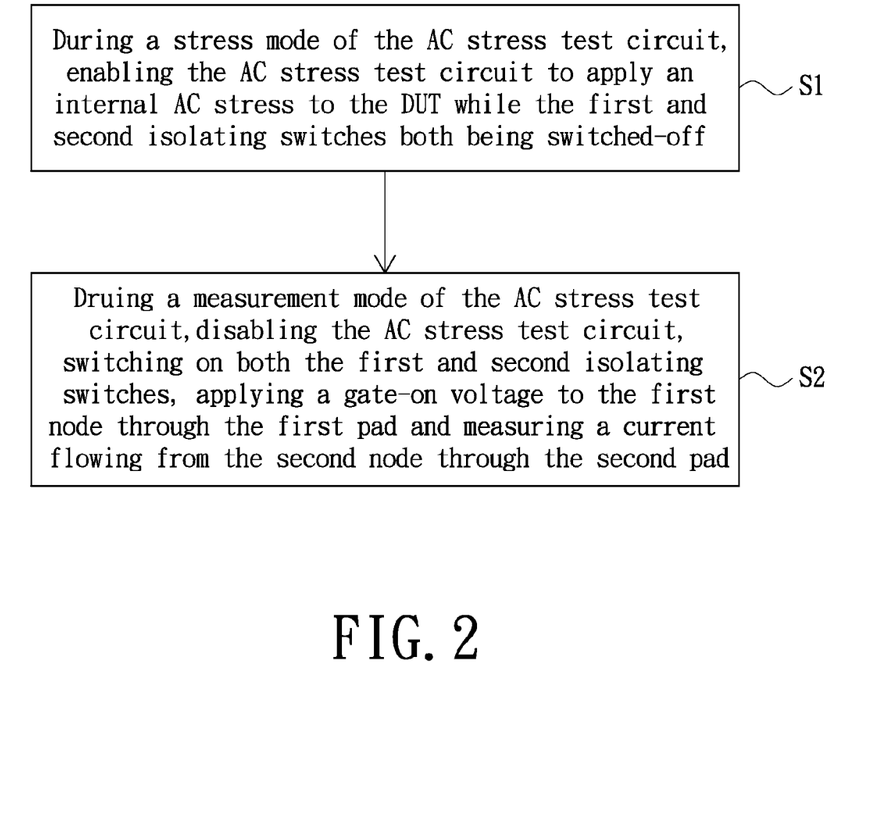
FIG. 2 shows a flowchart of a method for evaluating AC stress induced HCI degradation in accordance with an embodiment of the present invention.

A method of evaluating AC stress induced HCI degradation in semiconductor devices adapted to be performed on the AC stress test circuit 12 will be described below in detailed with reference to FIGS. 1 and 2. The evaluating method comprises the following steps S1 and S2.

In step S1: during a stress mode of the AC stress test circuit 12, the AC stress test circuit 12 is enabled by for example turning on the power supply voltage Vcc of the ring oscillator circuit and thereby an approximately realistic AC stress-voltage waveform is generated and applied to the DUT. The isolating switches 125 and 127 both are switched-off in order to avoid the probing pads 126, 128 to induce visible distortion to the internally generated AC stress waveform, this is because when the isolating switches 125 and 127 are switched-off, only parasitic capacitances Cgd of both the N-type transistors of the isolating switches 125, 127 are introduced into the ring oscillator circuit, the parasitic capacitances Cgd are too small to induce visible distortion to the AC stress waveform.

In step S2: during a measurement mode of the AC stress test circuit 12, the AC stress test circuit 12 is disabled by for example floating the power supply voltage Vcc of the stages except for the DUT or disconnecting the ring oscillator circuit via a pass gate, and thereby the stress-voltage waveform is stopped. The isolating switches 125 and 127 both are switched on, a gate-on voltage is applied to the node n1 through the probing pad 126 for biasing the P-type transistor 121 of the DUT. Herein, the N-type transistors of the isolating switches 125 and 127 are switched on by applying a logic "1" voltage through the control pad 129, the gate-on voltage is a logic "0" for enabling the P-type transistor 121 of the DUT. By measuring a current flowing from the node n2 through the probing pad 128, the Idsat change of the P-type transistor 121 of the DUT after AC stressing can be obtained.

It is understood that, by sequentially performing the steps S1 and S2 at least one time, the lifetime of the P-type transistor 121 e.g., 10% Idsat change during AC stressing can be acquired.

Figure 3:
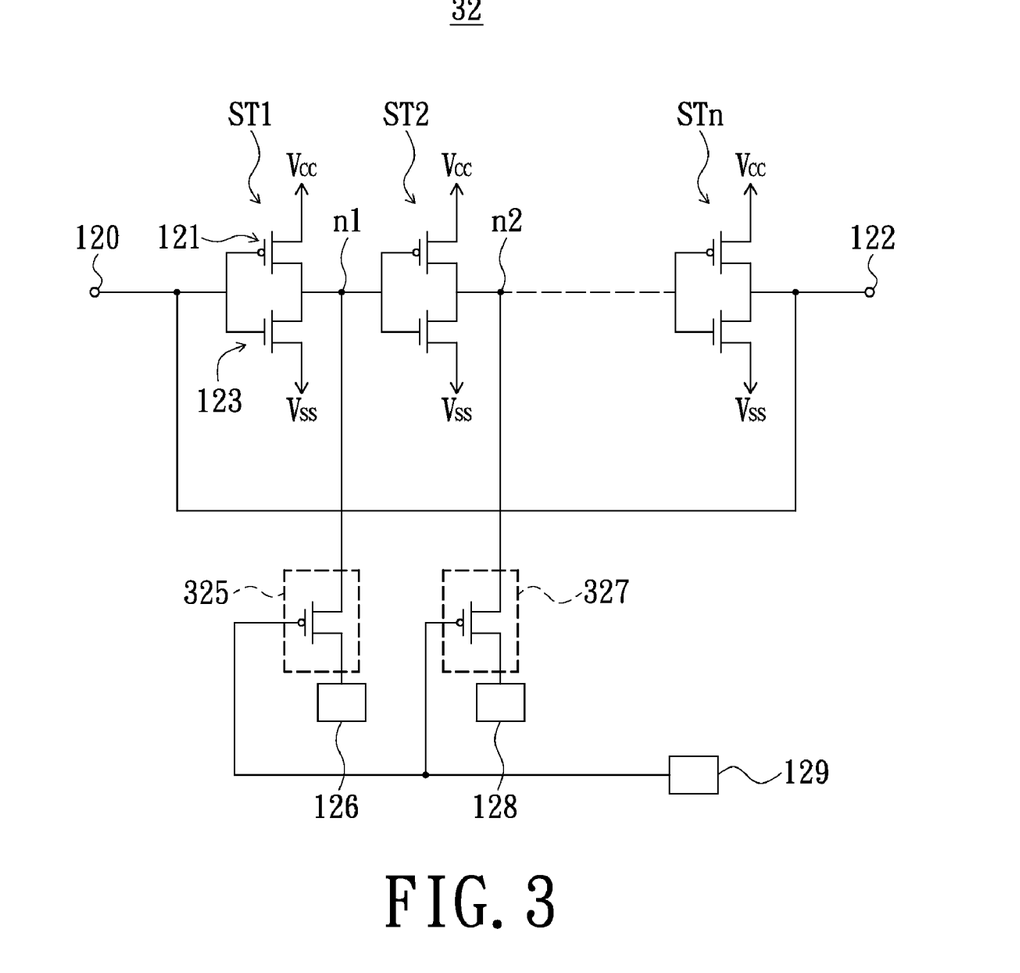
FIG. 3 shows a schematic circuit diagram of an AC stress test circuit in accordance with another embodiment of the present invention.

Referring to FIG. 3, showing a schematic circuit diagram of an AC stress test circuit in accordance with another embodiment of the present invention. As illustrated in FIG. 3, the AC stress test circuit 32 has a similar circuit configuration with respect to the AC stress test circuit 12 except for the isolating switches. In particular, the isolating switches 325 and 327 both are P-type transistors rather than the N-type transistors as illustrated in FIG. 1, such configuration generally can be used for evaluating AC stress induced HCI degradation in the N-type transistor 123 of the DUT. Correspondingly, when the above-mentioned evaluating method is performed on the AC stress test circuit 32, during a measurement mode of the AC stress test circuit 32, the P-type transistors of the isolating switches 325 and 327 are switched on by applying a logic "0" voltage through the control pad 129, and the gate-on voltage is a logic "1" for enabling the N-type transistor 123 of the DUT.

Figure 4:
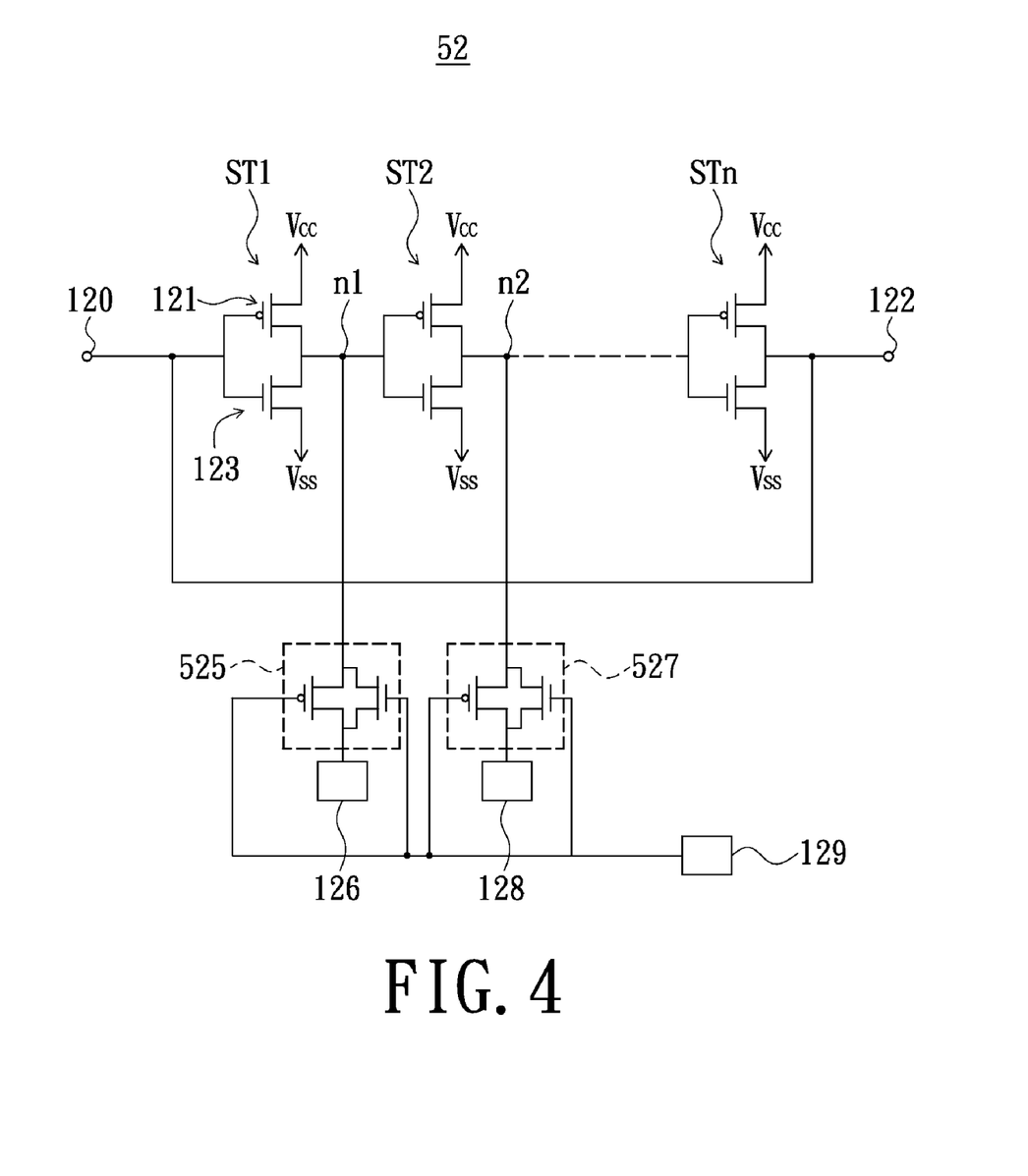
FIG. 4 shows a schematic circuit diagram of an AC stress test circuit in accordance with still another embodiment of the present invention.

Referring to FIG. 4, showing a schematic circuit diagram of an AC stress test circuit in accordance with still another embodiment of the present invention. As illustrated in FIG. 4, the AC stress test circuit 52 has a similar circuit configuration with respect to the AC stress test circuit 12 except for the isolating switches and the electrical connection of the control pad 129 with each of the isolating switches. In particular, the isolating switch 525 comprises a P-type transistor and an N-type transistor connected in parallel and between the node n1 and the probing pad 126. The isolating switch 527 comprises a P-type transistor and an N-type transistor connected in parallel and between the node n2 and the probing pad 128. The control pad 129 is directly electrically connected with the gates of the P-type transistors of the isolating switches 525 and 527, and indirectly electrically connected with each of the gates of the N-type transistors of the isolating switches 525 and 527 through an inverter (not labeled). In an alternative embodiment, the control pad 19 is directly electrically connected with the gates of the N-type transistors of the isolating switches 525 and 527, and indirectly electrically connected with each of the gates of the P-type transistors of the isolating switches 525 and 527 through an inverter instead. Such configuration generally can be used for evaluating AC stress induced HCI degradation in both the P-type transistor 121 and the N-type transistor 123 of the DUT.

Figure 5:
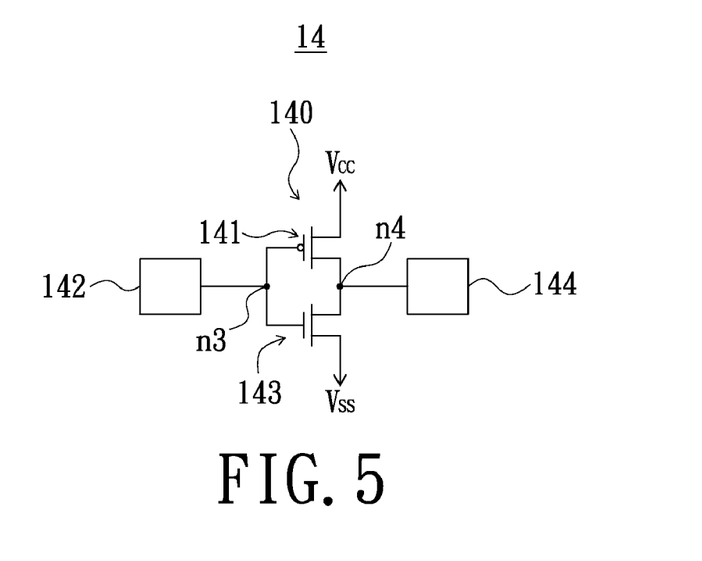
FIG. 5 shows a schematic circuit diagram of a DC stress test circuit in accordance with an embodiment of the present invention.

Referring to FIG. 5, showing a schematic circuit diagram of a DC stress test circuit in accordance with an embodiment of the present invention. As illustrated in FIG. 5, the DC stress test circuit 14 comprises a DUT 140, and pads 142, 144. The DUT 140 herein is an inverter and generally comprises a P-type transistor 141 and an N-type transistor 143 electrically connected between power supply voltage Vcc and Vss. The gate of the P-type transistor 141 and the gate of the N-type transistor 143 are connected with each other and whereby defining a node n3, the drain/source of the P-type transistor 141 and the drain/source of the N-type transistor 143 are connected with each other and whereby defining another node n4.

The pad 142 is electrically connected to the node n3 of the DUT 140 and generally serves as a DC stress-voltage input pad. The pad 144 is electrically connected to the node n4 of the DUT 140 and generally serves as a probing pad. In operation of the DC stress test circuit 14, DC stress-voltages are applied to the DUT 140 through the pad 142, and then by measuring a current flowing from the node n4 through the pad 144, the Idsat change of the P-type transistor 141 (or N-type transistor 143) during DC stressing can be obtained. As a result, a lifetime of the P-type transistor 141 (or N-type transistor 143) e.g., 10% Idsat change during DC stressing can be acquired. Herein, the DC stress test circuit 14 is independent from any one of the above-mentioned AC stress test circuits 12, 32 and 52, and furthermore, the DC stress test circuit 14 and any one of the AC stress test circuit 12, 32 and 52 cooperatively can constitute a test structure for HCI degradation evaluation in semiconductor devices, and the DUT of the DC stress test circuit is equipped with a same circuit configuration as the DUT of the AC stress test circuit.

Figure 6:
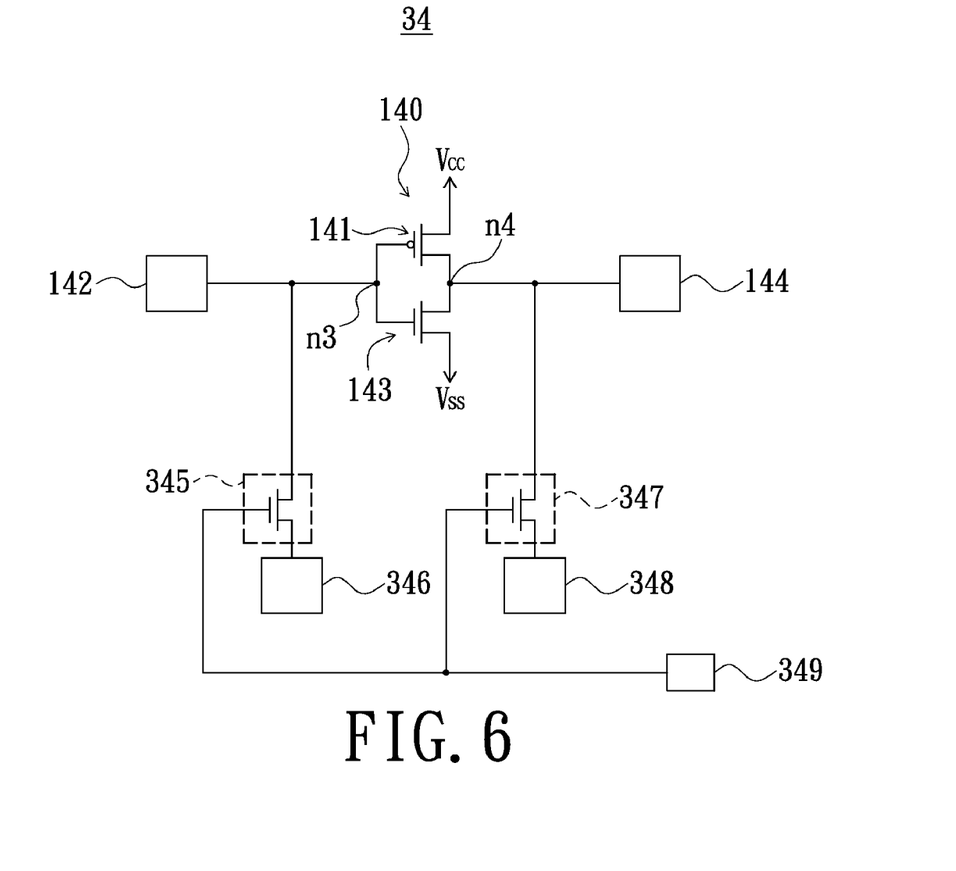
FIG. 6 shows a schematic circuit diagram of a DC stress test circuit in accordance with another embodiment of the present invention.

Referring to FIG. 6, showing a schematic circuit diagram of a DC stress test circuit in accordance with another embodiment of the present invention. As illustrated in FIG. 6, the DC stress test circuit 34 has a similar circuit configuration to the DC stress test circuit 14 except for additional isolating switches 345, 347, pads 346, 348 and control pad 349. In particular, the pad 346 is electrically connected to the node n3 through the isolating switch 345, the pad 348 is electrically connected to the node n4 through the isolating switch 347, the control pad 349 is electrically connected to both the gates of the isolating switches 345 and 347 and for receiving a control signal to switch ON/OFF states of the isolating switches 345 and 347. In operation of the DC stress test circuit 34, the isolating switches 345, 347 generally are always switched-off, the configuration of the additional isolating switches 345, 347, pads 346, 348 and control pad 349 is primarily for the purpose of facilitating the Idsat degradation behavior in the DC stress test circuit 34 to consist with Idsat degradation behavior in the AC stress test circuit. Moreover, in the illustrated embodiment, the isolating switches 345, 347 both are N-type transistors, and it can be understood that the isolating switches 345, 347 can be given the same circuit configuration as the isolating switches 325, 327 as illustrated in FIG. 3 or as the isolating switches 525, 527 as illustrated in FIG. 4, according to requirement of actual applications.

Additionally, the skilled person in the art can make some modifications with respect to the AC stress test circuit, evaluating method and DC stress test circuit in accordance with the above-mentioned embodiments, for example, suitably changing the circuit configuration of the isolating switches, using NOR or NAND to replace the inverter as each of the stages in the ring oscillator circuit, and so on, as long as such modification(s) would not depart from the scope and spirit of the present invention.

In summary, in the above-mentioned embodiments, the probing pads in each AC stress test circuit are electrically connected to the ring oscillator circuit through the isolating switches maintaining switched-off state during AC stressing (i.e., generally ring oscillator stressing), so that the probing pads could not distort AC stress waveforms internally generated by the ring oscillator circuit. Accordingly, the present invention can get AC Idsat degradation directly during ring oscillator stressing without any simulation and therefore the HCI degradation evaluation in semiconductor devices can achieve an increased accuracy.

The above description is given by way of example, and not limitation. Given the above disclosure, one skilled in the art could devise variations that are within the scope and spirit of the invention disclosed herein, including configurations ways of the recessed portions and materials and/or designs of the attaching structures. Further, the various features of the embodiments disclosed herein can be used alone, or in varying combinations with each other and are not intended to be limited to the specific combination described herein. Thus, the scope of the claims is not to be limited by the illustrated embodiments.

What is claimed is:

1. An alternating current (AC) stress test circuit for hot carrier injection (HCI) degradation evaluation in semiconductor devices, comprising:

a ring oscillator circuit having a plurality of stages electrically connected in series between an input terminal and an output terminal electrically connected with the input terminal and whereby forming a loop, wherein each of the stages comprises a first node and a second node, a designated one of the stages serves as device under test (DUT);

a first isolating switch and a second isolating switch, respectively electrically connecting the first node and the second node of the DUT;

an input means being electrically connected to the first isolating switch and for applying a gate on voltage to the first node through the first isolating switch to bias the DUT; and an output means being electrically connected to the second isolating switch and for measuring a current flowing from the second node through the second isolating switch.

2. The AC stress test circuit as claimed in claim 1, wherein the DUT comprises a first transistor and a second transistor having different conductivity, the gates of the first and second transistors are electrically connected to the first node, the drains/sources of the first and second transistors are electrically connected to the second node, the first isolating switch and the second isolating switch both have the same conductivity as the second transistor.

3. The AC stress test circuit as claimed in claim 1, wherein the DUT comprises a first transistor and a second transistor having different conductivity, the gates of the first and second transistors are electrically connected to the first node, the drains/sources of the first and second transistors are electrically connected to the second node, the first isolating switch and the second isolating switch both have the same conductivity as the first transistor.

4. The AC stress test circuit as claimed in claim 1, wherein the first isolating switch comprises a first transistor and a second transistor having different conductivity and electrically connected in parallel and between the first node and the first pad, the second isolating switch comprises a third transistor and a fourth transistor having the different conductivity and electrically connected in parallel and between the second node and the second pad.

5. The AC stress test circuit as claimed in claim 1, further comprising a control pad being electrically connected to the gates of the first and second isolating switches and for receiving a control signal to switch ON/OFF states of the first and second isolating switches.

6. The AC stress test circuit as claimed in claim 1, wherein each of the stages is an inverter.

7. The AC stress test circuit as claimed in claim 1, wherein the DUT and each of the input terminal and the output terminal have at least one of the remained stages arranged therebetween.

8. A method for evaluating AC stress induced HCI degradation in semiconductor devices, wherein the method is adapted to be performed on an AC stress test circuit, the AC stress test circuit comprises a ring oscillator circuit, a first pad, a second pad, a first isolating switch and a second isolating switch, the ring oscillator circuit having a plurality of stages electrically connected in series between an input terminal and an output terminal electrically connected with the input terminal and whereby forming a loop, each of the stages comprising a first node and a second node, a designated one of the stages serving as device under test (DUT), the first isolating switch and the second isolating switch respectively electrically connecting the first pad and the second pad to the first node and the second node of the DUT, the method comprises steps of:
during a stress mode of the AC stress test circuit, enabling the AC stress test circuit to apply an internal AC stress to the DUT while the first and second isolating switches both being switched-off; and
during a measurement mode of the AC stress test circuit, disabling the AC stress test circuit, switching on both the first and second isolating switches, applying a gate-on voltage to the first node through the first pad and measuring a current flowing from the second node through the second pad.

9. The method as claimed in claim 8, wherein the steps of switching on both the first and second isolating switches and applying the gate-on voltage to the first node through the first pad comprise:
switching on both the first and second isolating switches by a logic "1" voltage; and
applying a logic "0" voltage to the first node through the first pad.

10. The method as claimed in claim 8, wherein the steps of switching on both the first and second isolating switches and applying the gate-on voltage to the first node through the first pad comprise:
switching on both of the first and second isolating switches by a logic "0" voltage; and
applying a logic "1" voltage to the first node through the first pad.

11. A test structure for HCI degradation evaluation in semiconductor devices, the test structure comprising: an AC stress test circuit comprising: a ring oscillator circuit having a plurality of stages connected in series between an input terminal and an output terminal electrically connected with the input terminal and whereby forming a loop, wherein each of the stages comprises a first node and a second node, a designated one of the stages serves as a first DUT; a first probing pad and a second probing pad; and a first isolating switch and a second isolating switch, respectively electrically connecting the first probing pad and the second probing pad to the first node and the second node of the first DUT, wherein the first probing pad applies a gate on voltage to the first node through the first isolating switch to bias the first DUT and the second probing pad measures a current flowing from the second node through the second isolating switch; and a direct current (DC) stress test circuit independent from the AC stress test circuit, the DC stress test circuit comprising: a second DUT having a same circuit configuration as the first DUT and comprising a third node and a fourth node; and a third pad and a fourth pad, respectively electrically connected to the third node and the fourth node.

12. The test structure as claimed in claim 11, wherein the first DUT comprises a first transistor and a second transistor having different conductivity, the gates of the first and second transistors are electrically connected to the first node, the drains/sources of the first and second transistors are electrically connected to the second node, the first isolating switch and the second isolating switch both have the same conductivity as the second transistor.

13. The test structure as claimed in claim 11, wherein the first DUT comprises a first transistor and a second transistor having different conductivity, the gates of the first and second transistors are electrically connected to the first node, the drains/sources of the first and second transistors are electrically connected to the second node, the first isolating switch and the second isolating switch both have the same conductivity as the first transistor.

14. The test structure as claimed in claim 11, wherein the first isolating switch comprises a second transistor and a first transistor having different conductivity and electrically connected in parallel and between the first node and the first pad, the second isolating switch comprises a fourth transistor and a third transistor having the different conductivity and electrically connected in parallel and between the second node and the second pad.

15. The test structure as claimed in claim 11, wherein the AC stress test circuit further comprises a control pad being electrically connected to the gates of the first and second isolating switches and for receiving a control signal to switch ON/OFF states of the first and second isolating switches.

16. The test structure as claimed in claim 11, wherein each of the stages is an inverter.

17. The test structure as claimed in claim 11, wherein the DC stress test circuit further comprises:
a fifth pad and a sixth pad; and
a third isolating switch and a fourth isolating switch, respectively electrically connecting the fifth pad and the sixth pad to the third node and the fourth node;
wherein the third and fourth isolating switches both are always switched-off during the DC stress test circuit in operation.

18. The test structure as claimed in claim 11, wherein the first DUT and each of the input terminal and the output terminal have at least one of the remained stages arranged therebetween.

* * * * *